(12) United States Patent
Tayebati

(10) Patent No.: US 6,463,085 B1
(45) Date of Patent: Oct. 8, 2002

(54) COMPACT EXTERNAL CAVITY TUNABLE LASERS USING HYBRID INTEGRATION WITH MICROMACHINED AND ELECTROOPTIC TUNABLE ELEMENTS

(75) Inventor: Barviz Tayebati, Boston, MA (US)

(73) Assignee: CoreTek, Inc., Wilmington, MA (US)

( * ) Notice: Subject to any disclaimer, the term of this patent is extended or adjusted under 35 U.S.C. 154(b) by 0 days.

(21) Appl. No.: 09/386,603

(22) Filed: Aug. 31, 1999

Related U.S. Application Data

(60) Provisional application No. 60/099,556, filed on Sep. 9, 1998.

(51) Int. Cl.[7] .................................................. H01S 3/10
(52) U.S. Cl. .......................... 372/20; 372/32; 372/102; 372/45; 372/96; 372/92
(58) Field of Search .............................. 372/92, 96, 32, 372/107, 20, 45; 250/234; 219/121.85; 359/291

(56) References Cited

U.S. PATENT DOCUMENTS

| | | | | |
|---|---|---|---|---|
| 5,274,230 A | * | 12/1993 | Kajimura et al. ........... 250/234 |
| 5,629,951 A | * | 5/1997 | Chang-Hasnain et al. .... 372/20 |
| 5,739,945 A | * | 4/1998 | Tayebati ...................... 359/291 |
| 5,771,253 A | * | 6/1998 | Chang-Hasnain et al. .... 372/20 |
| 5,916,463 A | * | 6/1999 | Hoving et al. ......... 219/121.85 |
| 6,181,717 B1 | * | 1/2001 | Kuer et al. .................... 372/20 |

* cited by examiner

*Primary Examiner*—Leon Scott, Jr.
(74) *Attorney, Agent, or Firm*—Pandiscio & Pandiscio

(57) ABSTRACT

An external cavity laser tuner. One embodiment constructed according to principles of the invention includes a cantilever interposed between the laser cavity mirrors or operating as a mirror. Another embodiment constructed according to principles of the invention includes a torsional mirror interposed between the laser cavity mirrors or operating as a mirror. A further embodiment constructed according to principles of the invention includes a torsional filter interposed between the laser cavity mirrors. An additional embodiment constructed according to principles of the invention includes an electrooptic prism interposed between the laser cavity mirrors.

26 Claims, 7 Drawing Sheets

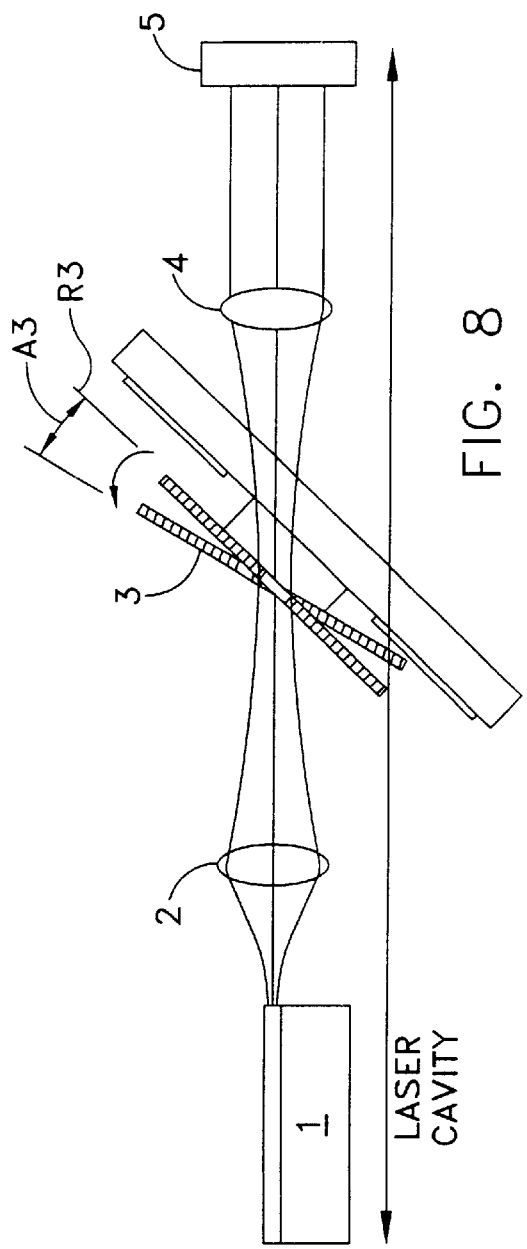
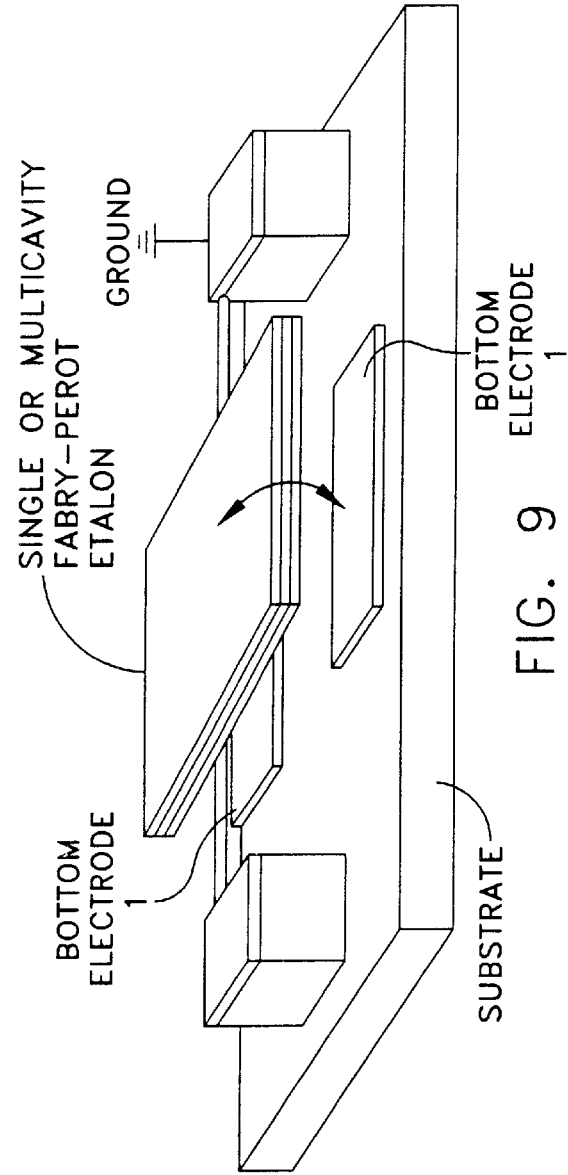

COMPACT EXTERNAL CAVITY TUNABLE LASERS USING HYBRID INTEGRATION WITH MICROMACHINED AND ELECTROOPTIC TUNABLE ELEMENTS

REFERENCE TO EARLIER APPLICATION

This Application claims the benefit of United States Provisional Application No. 60/099,556, filed Sep. 9, 1998, by P. Tayebati, entitled Compact External Cavity Tunable Lasers Using Hybrid Integration With Micromachined And Electrooptic Tunable Elements.

FIELD OF THE INVENTION

The invention relates to lasers, and more specifically to tuning external cavity lasers.

BACKGROUND OF THE INVENTION

Lasers are well known in the art. A laser typically comprises a front mirrored end and a rear mirrored end which are disposed so as to establish a reflective cavity therebetween. An active, or gain, region is disposed between the two mirrored ends. The gain region is constructed so that when the gain medium is appropriately stimulated, it will emit light. The rear mirror typically is substantially fully reflective at the wavelengths of interest, and the front mirror typically is partially reflective at the wavelengths of interest so as to allow a beam of laser light to be emitted therefrom.

A laser may be tuned to emit light at wavelengths of interest. Tuning the laser promotes emission of light at a desired wavelength. Tuning typically involves absorbing or scattering light outside the desired wavelength.

SUMMARY OF THE INVENTION

The invention is an external cavity laser tuner.

One embodiment constructed according to the principles of the invention includes a cantilever interposed between the laser cavity mirrors or operating as a mirror.

Another embodiment constructed according to the principles of the invention includes a torsional mirror interposed between the laser cavity mirrors or operating as a mirror.

A further embodiment constructed according to the principles of the invention includes a torsional filter interposed between the laser cavity mirrors.

An additional embodiment constructed according to principles of the invention includes an electrooptic prism interposed between the laser cavity mirrors.

These and other features of the invention will be appreciated more readily in view of the drawings and detailed description below.

BRIEF DESCRIPTION OF THE DRAWINGS

The invention is described in detail below with reference to the following drawings, throughout which similar reference characters denote corresponding features consistently, wherein:

FIG. 8 is a schematic representation of an external cavity laser including yet another embodiment of a laser tuner constructed according to principles of the invention;

FIG. 9 is a perspective view of the laser tuner of FIG. 8;

DETAILED DESCRIPTION OF THE INVENTION

The invention is an external cavity laser tuner. The four embodiments of a tuner for tuning a diode laser system integrate micro-electromechanical components and electrooptic components with a semiconductor gain medium.

1. Tunable External Cavity Laser Diode Using A Micromachined Cantilever.

Figure 1:
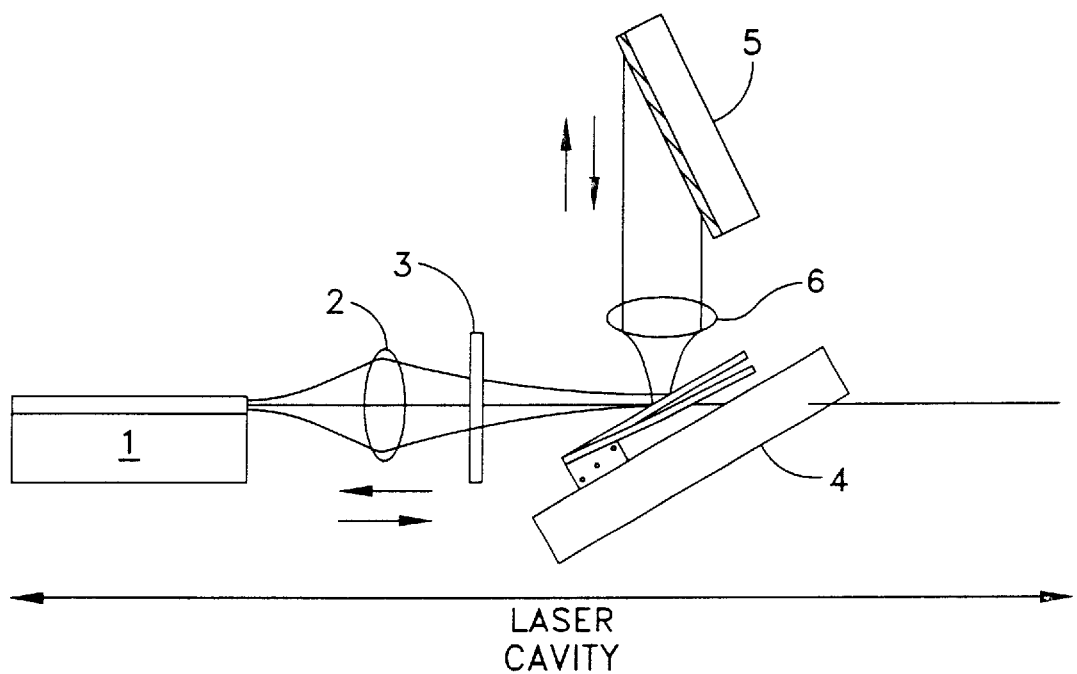
FIG. 1 is a schematic representation of an external cavity laser including an embodiment of a laser tuner constructed according to principles of the invention.

Referring to FIG. 1, a tunable external cavity laser is shown including a micro-electromechanical cantilever. The laser includes a semiconductor optical amplifier (SOA) 1; a beam shaping lens system 2; an appropriate waveplate 3; the microelectromechanical or microelectromagnetic cantilever 4; a diffraction grating 5; and a collimating lens 6.

This embodiment of an external cavity tunable laser employs an antireflection-coated SOA 1 as a gain medium. Light introduced into the SOA excites the atomic structure of the SOA which intensifies the energy level of light directed therethrough. Alternatively, electrical energy may be introduced into the SOA for intensifying the energy level of the light.

The lens 2 shapes the emerging emission from the SOA 1 and directs the beam onto a waveplate 3. The waveplate 3 polarizes the beam.

From the waveplate 3, the light beam is focused onto a micromachined beam steering cantilever 4. The output beam then is collimated with a lens 6 and projected onto a diffraction grating 5.

The foregoing elements are arranged in a geometry that retro-reflects some wavelength of light back into the SOA.

Figure 3:
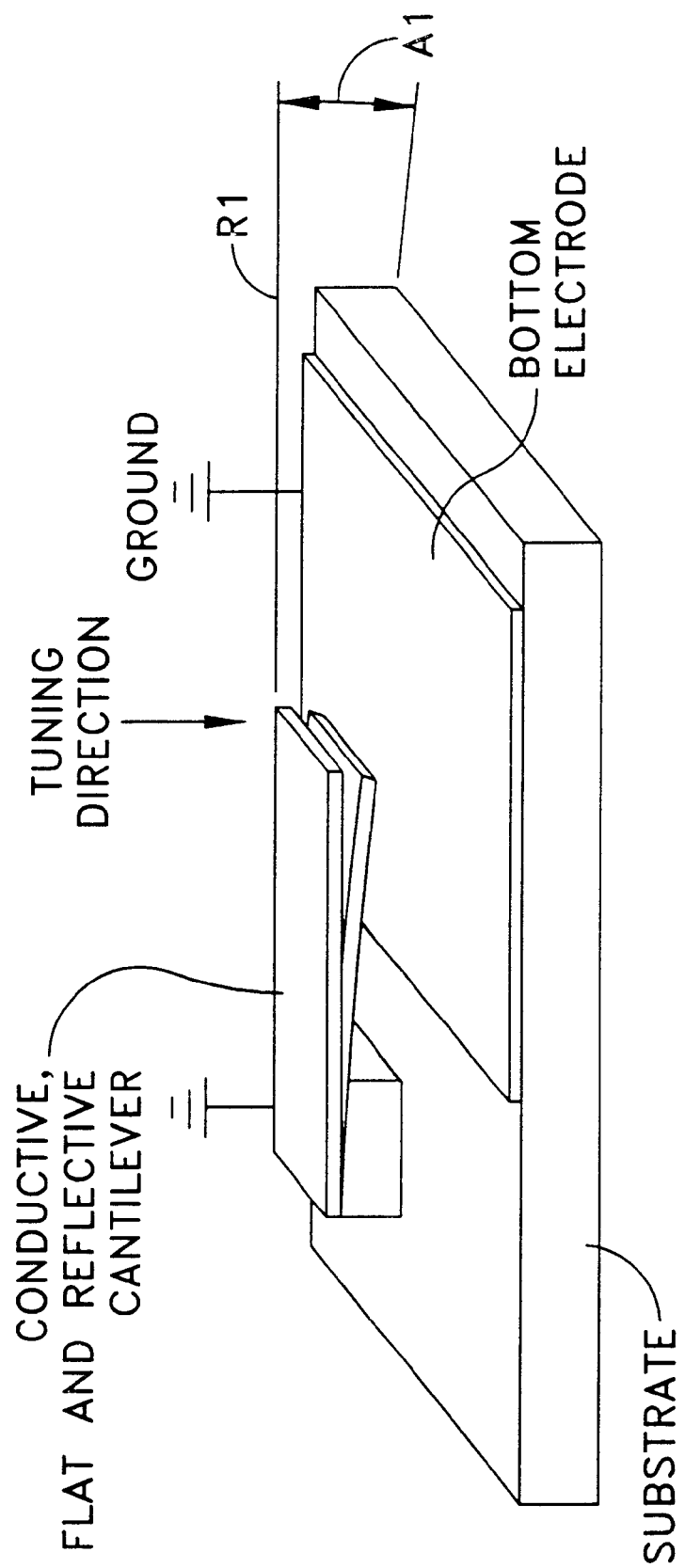
FIG. 3 is a top perspective view of the laser tuner of FIGS. 1 and 2.

Referring to FIG. 3, the cantilever 4 has a length ranging from 100 μm to 500 μm and a width ranging from 50 μm to 300 μm. The cantilever 4 is tuned electrostatically or electromagnetically in ways known in the art of micromechanical technology. By tuning the angle A1 of the cantilever relative to a reference line R1, a different wavelength of light is generated by the cavity.

Figure 2:
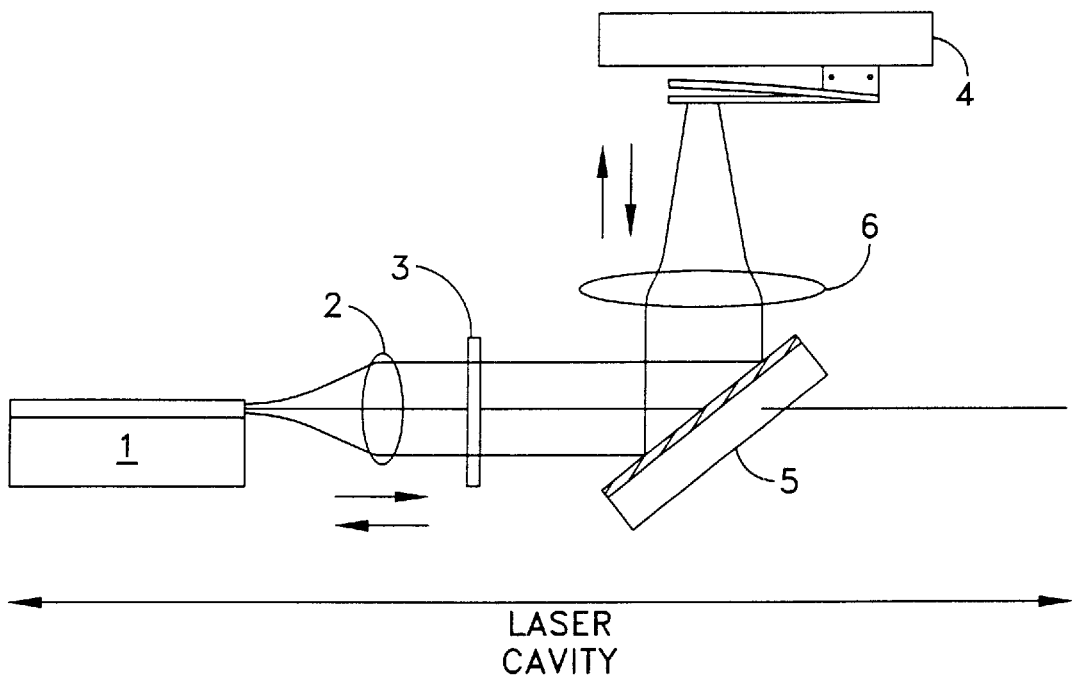
FIG. 2 is a schematic representation of an external cavity laser including another embodiment of a laser tuner constructed according to principles of the invention.

In FIG. 2 a variant of the tunable laser is shown in which an antireflection-coated SOA 1 again is the gain medium. A lens 2 and a waveplate 3 shape and polarize the emerging emission from the SOA. The output beam is collimated and projected onto a diffraction grating 5. The diffracted light then is focused with the collimating lens 6 onto a micromachined beam steering cantilever 4, as described above.

As with the embodiment of FIG. 1, the elements are arranged in a geometry that retro-reflects some wavelength of light back into the SOA. Also, by tuning the angle A1 of the cantilever 4 relative to a reference line R1, a different wavelength of light is generated by the cavity.

2. Tunable External Cavity Laser Diode Using A Microelectromechanical Torsion Mirror.

Figure 4:
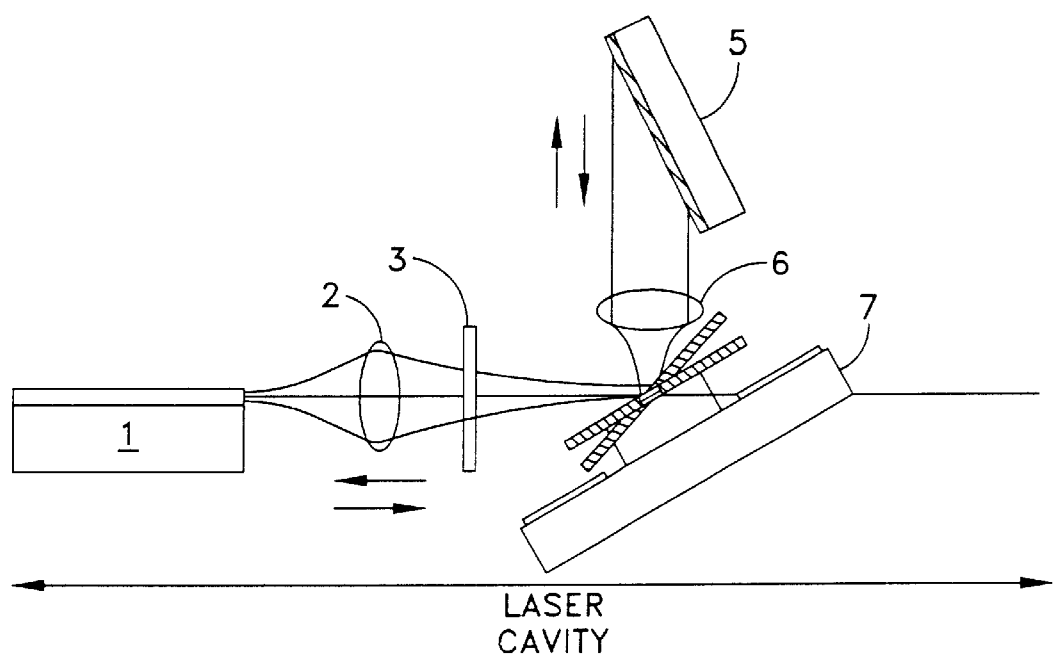
FIG. 4 is a schematic representation of an external cavity laser including a further embodiment of a laser tuner constructed according to principles of the invention.

Referring to FIG. 4, a tunable external cavity laser is shown including a microelectromechanical or mircroelectromagnetic torsion mirror. The device includes a semiconductor optical amplifier (SOA) 1; a beam shaping lens system 2; an appropriate waveplates 3; a diffraction grating 5; a collimating lens 6; and the torsion mirror 7.

This embodiment of an external cavity tunable laser employs an antireflection-coated SOA 1 as a gain medium.

The lens 2 shapes the emerging emission from the SOA 1 and directs the beam onto a waveplate 3. The waveplate 3 polarizes the beam.

From the waveplate 3, the light beam is focused onto a micromachined beam-steering torsion mirror 7. The output beam then is collimated using a lens 6 and projected onto a diffraction grating 5.

The foregoing elements are arranged in a geometry that retro-reflects some wavelength of light back into the SOA.

Figure 6:
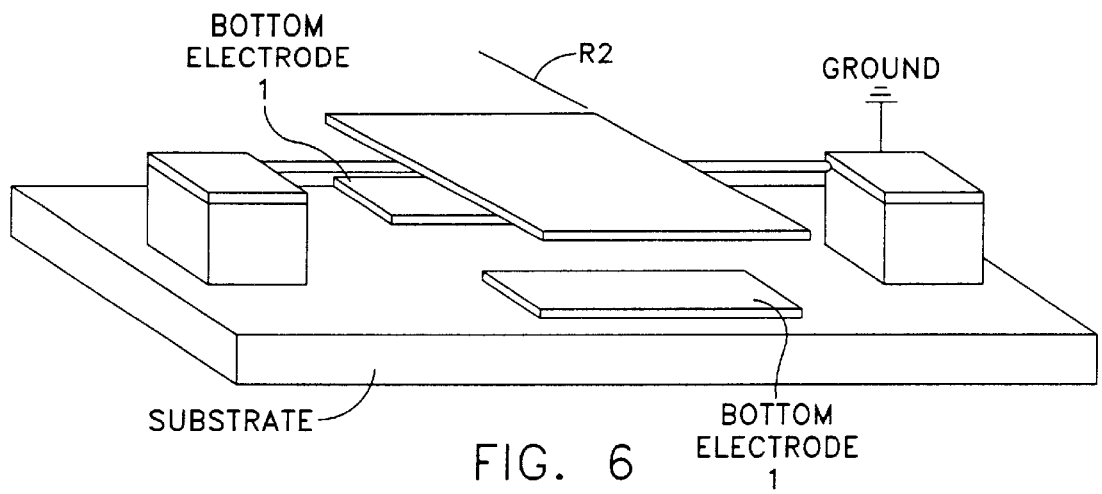
FIGS. 6 and 7 are perspective views of the laser tuner of FIGS. 4 and 5, showing articulation thereof.
Figure 7:
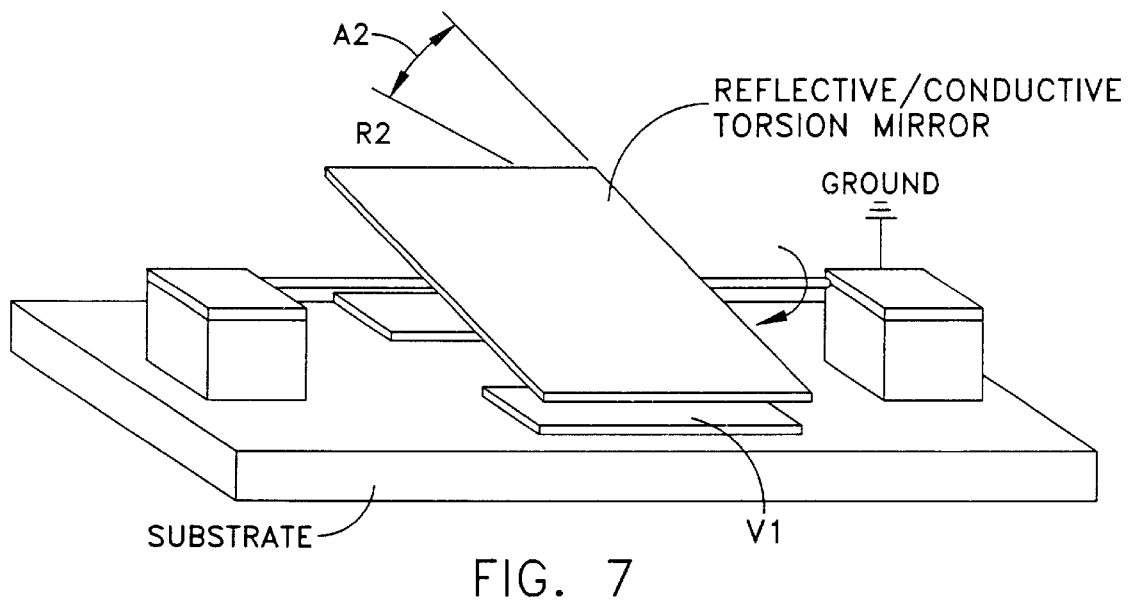

Referring to FIGS. 6 and 7, the mirror has dimensions ranging from 10 µm to 500 µm. The mirror has torsion arms with lengths ranging from 10 µm to 300 µm.

The torsion mirror is tuned electrostatically or electromagnetically in ways known in the art of micromechanical technology. By tuning the angle A2 of the torsion mirror relative to a reference line R2, a different wavelength of light is generated by the cavity.

Figure 5:
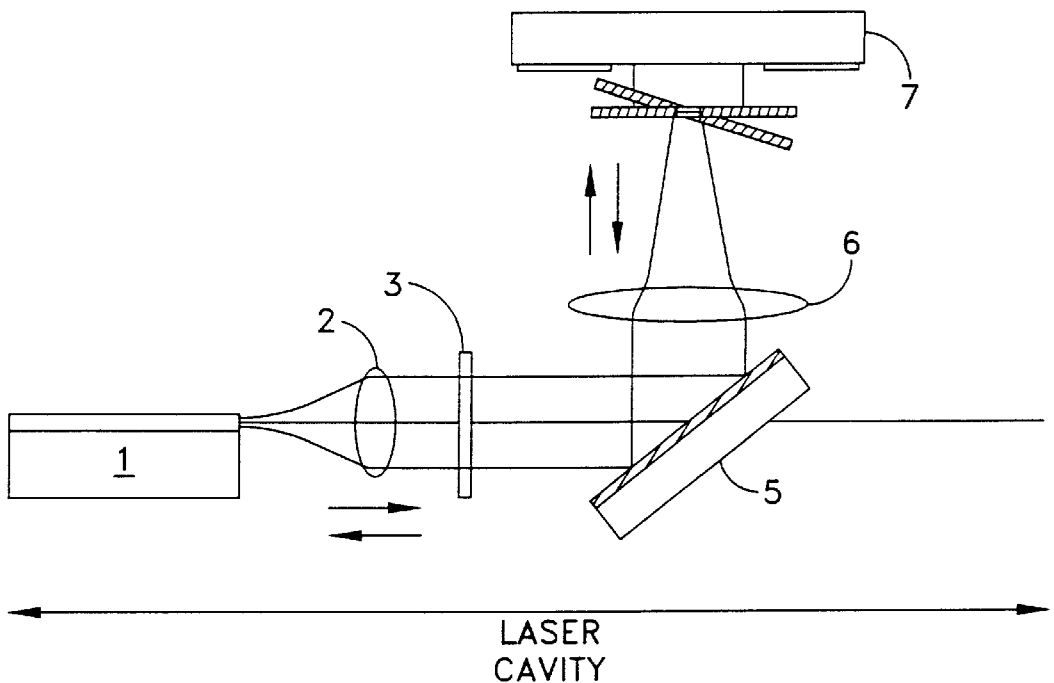
FIG. 5 is a schematic representation of an external cavity laser including an additional embodiment of a laser tuner constructed according to principles of the invention.

In FIG. 5 a variant of the tunable laser is shown including an antireflection-coated SOA 1 as a gain medium. A lens 2 and a waveplate 3 shape the beam and polarization of the emerging emission from the SOA. The output beam is collimated and projected onto a diffraction grating 5. The diffracted light is focused, using a lens 6, onto a micromachined beam-steering torsion mirror 7, as described above.

As with the embodiment of FIG. 4, the elements are arranged in a geometry that retro-reflects some wavelength of light back into the SOA. Also, by tuning the angle A2 of the torsion mirror relative to a reference line R2, a different wavelength of light is generated by the cavity.

3. Tunable External Cavity Laser Diode Using A Tunable Microelectromechanical Torsion Filter.

Referring to FIG. 8, an external cavity tunable laser is shown including a microelectromechanical or mircroelectromagnetic torsion Fabry-Perot filter. The device includes a semiconductor optical amplifier (SOA) 1; a beam-shaping lens system 2; the torsion Fabry-Perot filter 3; a collimating lens 4; and a mirror 5.

This embodiment of an external cavity tunable laser employs an antireflection-coated SOA 1 as a gain medium.

The lens 2 shapes the profile of the emerging emission from the SOA 1. The light then is focused onto a micromachined torsion filter 3. The output beam is collimated and returned to the SOA with a lens 4 and a mirror 5.

Referring to FIG. 9, the filter has a dimension ranging from 10 µm to 500 µm. The filter has torsion arms with lengths ranging from 10 µm to 300 µm. The filter area is a multicavity or single cavity filter deposited with standard methods.

The torsion filter is tuned electrostatically or electromagnetically in ways known in the art of micromechanical technology. By tuning the torsion filter, the angle A3 of the torsion filter is adjusted relative to a reference line R3. The transmission wavelength of the Fabry-Perot filter is modified correspondingly and a different wavelength of light generated by the laser cavity.

The torsion filter is independently an innovative technology claimed by the inventor.

4. Tunable External Cavity Laser Diode Using An Electrooptic Prism.

Figure 10:
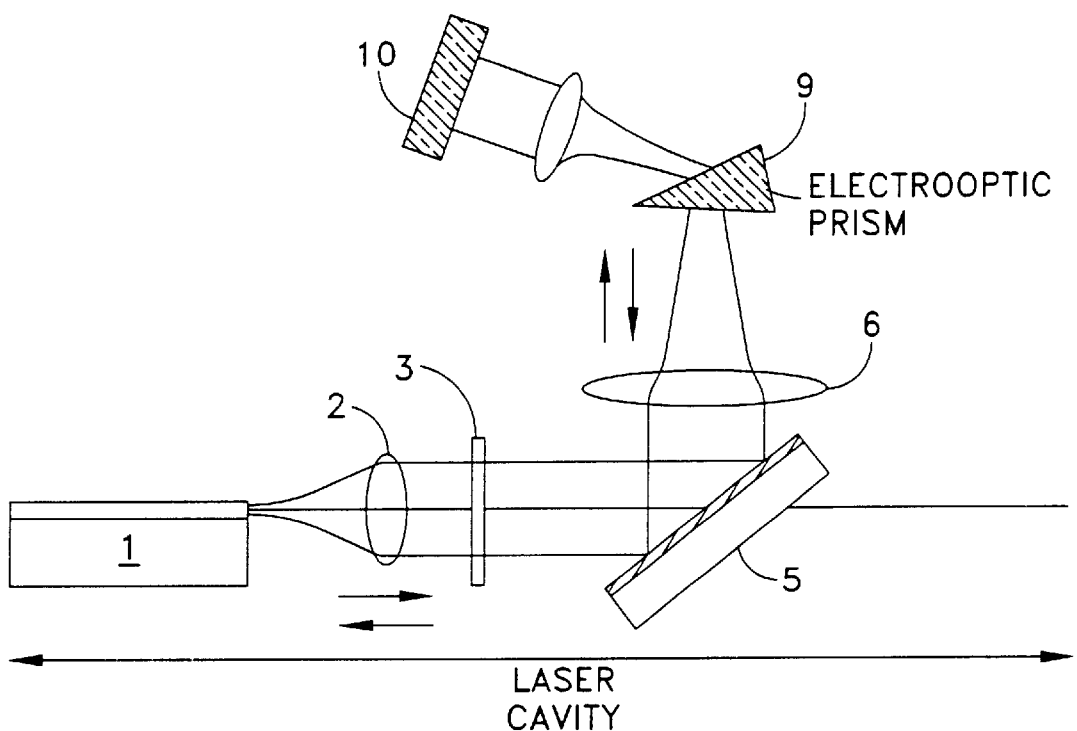
FIG. 10 is a schematic representation of an external cavity laser including yet a further embodiment of a laser tuner constructed according to principles of the invention.

Referring to FIG. 10, an external cavity laser is shown including an electrooptic prism. The device includes a semiconductor optical amplifier (SOA) 1; a beam-shaping lens system 2; an appropriate waveplate 3; a diffraction grating 5; a collimating lens 6; a beam-stirring electrooptic prism 9; and a mirror 10.

This embodiment of an external cavity tunable laser employs an antireflection-coated SOA 1 as a gain medium. The lens 2 and waveplate 3 shape the beam and polarization of the emerging emission from the SOA. The light then is collimated and projected onto the diffraction grating 5. The diffracted light is focused onto a beam-steering electrooptic prism 9 using the lens 6 and projected onto a combination of mirror 10 and lens.

The device is configured with a geometry that retro-reflects some wavelength of light back into SOA causing laser oscillations.

Figure 12:
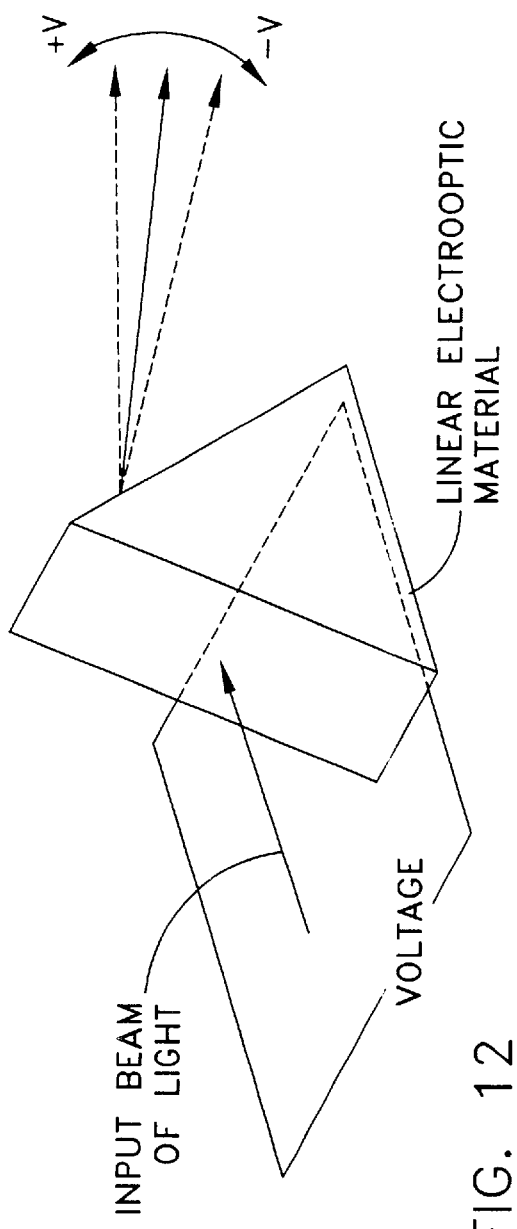
FIGS. 12 and 13 are schematic representations of the laser tuner of FIGS. 10 and 11, showing different voltage-related tuning characteristics thereof.
Figure 13:
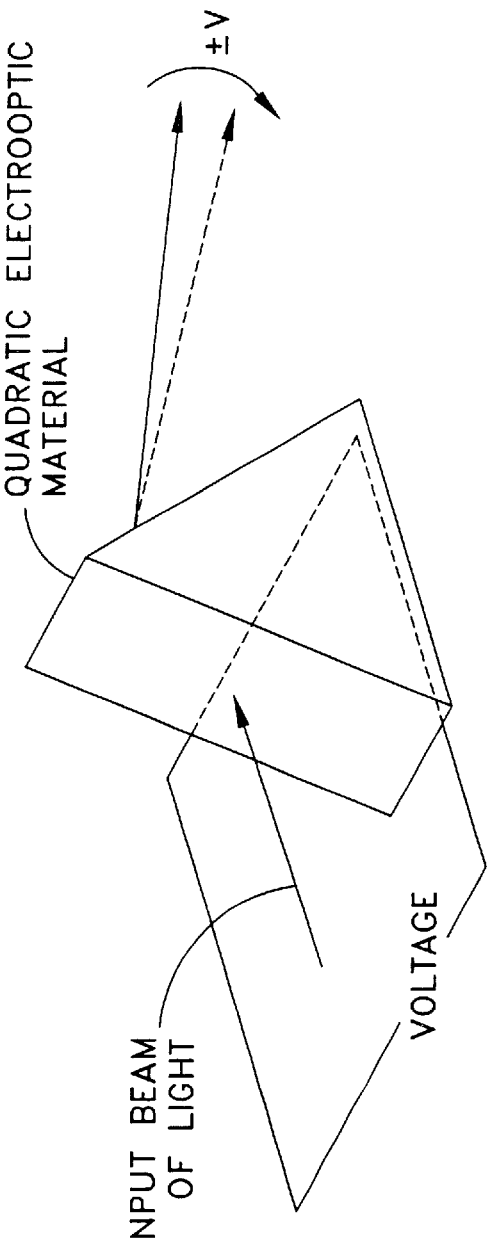

Referring to FIGS. 12 and 13, the electrooptic prism 9 is tuned by applying a voltage across the prism 9. Altering the voltage alters the index of refraction of the prism 9 which stirs the exiting beam. Tuning the angle of the beam promotes different wavelengths of light in cavity.

The electrooptic prism 9 may be constructed from linear or quadratic electrooptic crystals or materials.

Figure 11:
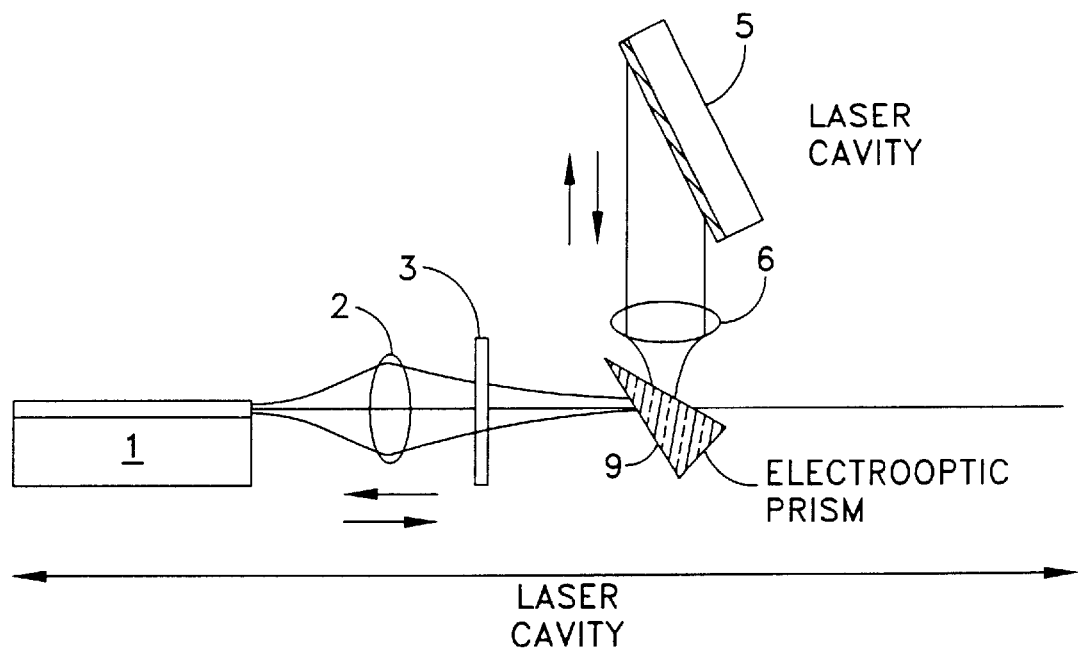
FIG. 11 is a schematic representation of an external cavity laser including yet an additional embodiment of a laser tuner constructed according to principles of the invention.

In FIG. 11 a variant of the tunable laser is shown in which an antireflection-coated SOA 1 is used as a gain medium. A lens 2 and a waveplate 3 shape the beam and polarization of the emerging emission from the SOA. The output beam then is focused and incident onto one side of an electrooptic prism 9. The refracted light is collimated with the lens 6 onto a diffraction grating 5.

As with the foregoing embodiment, the device is configured with a geometry which retroreflects the diffracted light. Also, tuning the angle of the beam promotes different wavelengths of light in cavity.

The invention is not limited to the foregoing, but encompasses all improvements and substitutions consistent with the principles of the invention.

What is claimed is:

1. A laser assembly comprising:
    a laser cavity formed by a front mirror and a back mirror;
    a gain region disposed between the front mirror and the back mirror; and
    a tuner at least partially disposed between the gain region and the front mirror for selectively retroreflecting light emitted by the gain region back into the gain region, whereby to tune the light output by the laser, wherein the tuner comprises a refraction grating adapted to receive light emitted by the gain region and a cantilever carrying a mirror thereon for selectively reflecting light received from the refraction grafting back into the gain region.

2. The laser assembly of claim 1, said cantilever being interposed between the front mirror and the back mirror defining the laser cavity of the laser assembly.

3. The laser assembly of claim 1, wherein said cantilever functions as a mirror of the laser assembly.

4. The laser assembly of claim 1, wherein said cantilever has a length ranging from 100 μm to 500 μm.

5. The laser assembly of claim 1, wherein said cantilever has a width ranging from 50 μm to 300 μm.

6. The laser assembly of claim 1, wherein said cantilever is tuned electrostatically or electromagnetically.

7. The laser assembly of claim 1, further comprising at least one mirror and a gain medium.

8. A laser assembly comprising:
   a laser cavity formed by a front mirror and a back mirror;
   a gain region disposed between the front mirror and the back mirror; and
   a tuner at least partially disposed between the gain region and the front mirror for selectively retroreflecting light emitted by the gain region back into the gain region, whereby to tune the light output by the laser, wherein the tuner comprises a torsion mirror adapted to receive light emitted by the gain region and a cantilever carrying a mirror thereon for selectively reflecting light received from the torsion mirror back into the gain region.

9. The laser assembly of claim 8, said torsion mirror being interposed between the front mirror and the back mirror defining a cavity of the laser assembly.

10. The laser assembly of claim 8, wherein said torsion mirror functions as a mirror of the laser assembly.

11. The laser assembly of claim 8, wherein said torsion mirror has a dimension ranging from 10 μm to 500 μm.

12. The laser assembly of claim 8, wherein said torsion mirror has a torsion arm length ranging from 10 μm to 300 μm.

13. The laser assembly of claim 8, wherein said torsion mirror is tuned electrostatically or electromagnetically.

14. The laser assembly of claim 8, further comprising at least one mirror and a gain medium.

15. A laser assembly comprising:
   a laser cavity formed by a front mirror and a back mirror;
   a gain region disposed between the front mirror and the back mirror; and
   a tuner at least partially disposed between the gain region and the front mirror for selectively retroreflecting light emitted by the gain region back into the gain region, whereby to tune the light output by the laser, wherein the tuner comprises a torsion filter adapted to receive light emitted by the gain region and a cantilever carrying a mirror thereon for selectively reflecting light received from the torsion filter back into the gain region.

16. The laser assembly of claim 15, said torsion filter being interposed between a front mirror and a back mirror of the laser assembly.

17. The laser assembly of claim 15, wherein said torsion filter has a dimension ranging from 10 μm to 500 μm.

18. The laser assembly of claim 15, wherein said torsion filter has a torsion arm length ranging from 10 μm to 300 μm.

19. The laser assembly of claim 15, wherein said torsion filter is tuned electrostatically or electromagnetically.

20. The laser assembly of claim 15, further comprising at least one mirror and a gain medium.

21. A laser assembly comprising:
   a laser cavity formed by a front mirror and a back mirror;
   a gain region disposed between the front mirror and the back mirror; and
   a tuner at least partially disposed between the gain region and the front mirror for selectively retroreflecting light emitted by the gain region back into the gain region, whereby to tune the light output by the laser, wherein the tuner comprises an electrooptic prism adapted to receive light emitted by the gain region and a cantilever carrying a mirror thereon for selectively reflecting light received from the electrooptic prism back into the gain region.

22. The laser assembly of claim 21, said electrooptic prism being interposed between the front mirror and the back mirror of the laser assembly.

23. The laser assembly of claim 22, including a diffraction grating interposed between said electrooptic prism and one of the front mirror and the back mirror.

24. The laser assembly of claim 21, wherein said electrooptic prism has an index of refraction that corresponds to a voltage applied across said electrooptic prism.

25. The laser assembly of claim 21, wherein said electrooptic prism is constructed from linear or quadratic electrooptic crystals or materials.

26. The laser assembly of claim 21, further comprising at least one mirror and a gain medium.

* * * * *

UNITED STATES PATENT AND TRADEMARK OFFICE
CERTIFICATE OF CORRECTION

PATENT NO. : 6,463,085 B1
DATED : October 8, 2002
INVENTOR(S) : Parviz Tayebati

It is certified that error appears in the above-identified patent and that said Letters Patent is hereby corrected as shown below:

<u>Title page,</u>
Item [75], please change the first name of the inventor from "Barviz" to -- Parviz --.

Signed and Sealed this

Twenty-fifth Day of February, 2003

JAMES E. ROGAN
*Director of the United States Patent and Trademark Office*